(12) United States Patent
Tigges et al.

(10) Patent No.: US 6,545,464 B1
(45) Date of Patent: Apr. 8, 2003

(54) INDUCTIVE PROXIMITY SWITCH

(75) Inventors: Burkhard Tigges, Balve (DE); Michael Faber, Lüdenscheid (DE)

(73) Assignee: Werner Turck GmbH & Co. KG, Halver (DE)

( * ) Notice: Subject to any disclaimer, the term of this patent is extended or adjusted under 35 U.S.C. 154(b) by 0 days.

(21) Appl. No.: 09/496,388

(22) Filed: Feb. 2, 2000

(51) Int. Cl.[7] .................................................. G01B 7/14
(52) U.S. Cl. ............................ 324/207.26; 324/207.12
(58) Field of Search ........................... 324/207.26, 236, 324/207.12, 207.16; 307/116; 331/65

(56) References Cited

U.S. PATENT DOCUMENTS

| 4,513,257 | A | * | 4/1985 | Miyamoto et al. ............. 331/65 |
| 5,264,733 | A | * | 11/1993 | Tigges ......................... 307/116 |
| 5,367,221 | A | * | 11/1994 | Santy et al. .................... 315/8 |
| 5,914,593 | A | * | 6/1999 | Arms et al. ............. 324/207.12 |
| 6,014,610 | A | * | 1/2000 | Judge et al. .................... 702/92 |

FOREIGN PATENT DOCUMENTS

DE          4031252       10/1991

* cited by examiner

Primary Examiner—Jay Patidar
(74) Attorney, Agent, or Firm—Martin A. Farber

(57) ABSTRACT

An inductive proximity switch having a coil situated to the rear of an "active" housing wall and belonging to a receiver circuit, whose signal changes as a metallic object approaches, the coil being operatively connected to a switching amplifier which changes its switching state when the object reaches a predetermined distance. In order to reduce the influence on the switching distance of any covering of the active surface with welding dust, there is a supplementary sensor, associated with the "active" housing wall (2), to provide electronic compensation for changes in the receiver signals produced by metallic deposits, especially ferritic deposits, on the "active" housing wall (2).

13 Claims, 3 Drawing Sheets

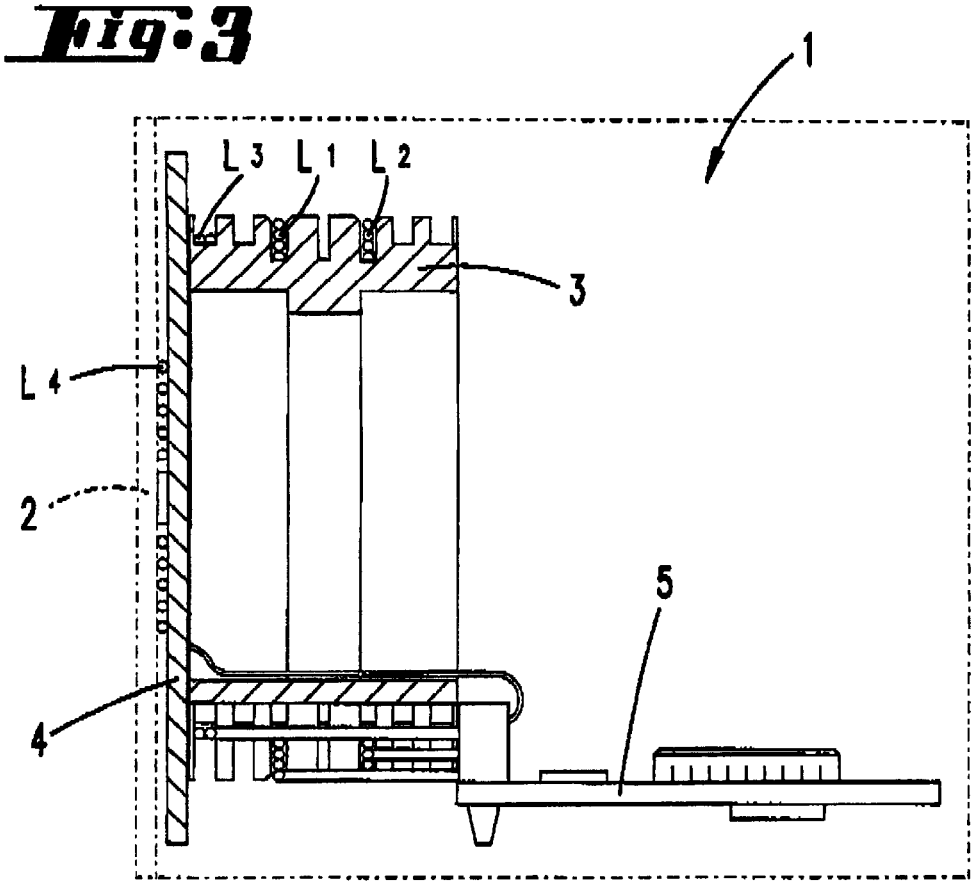
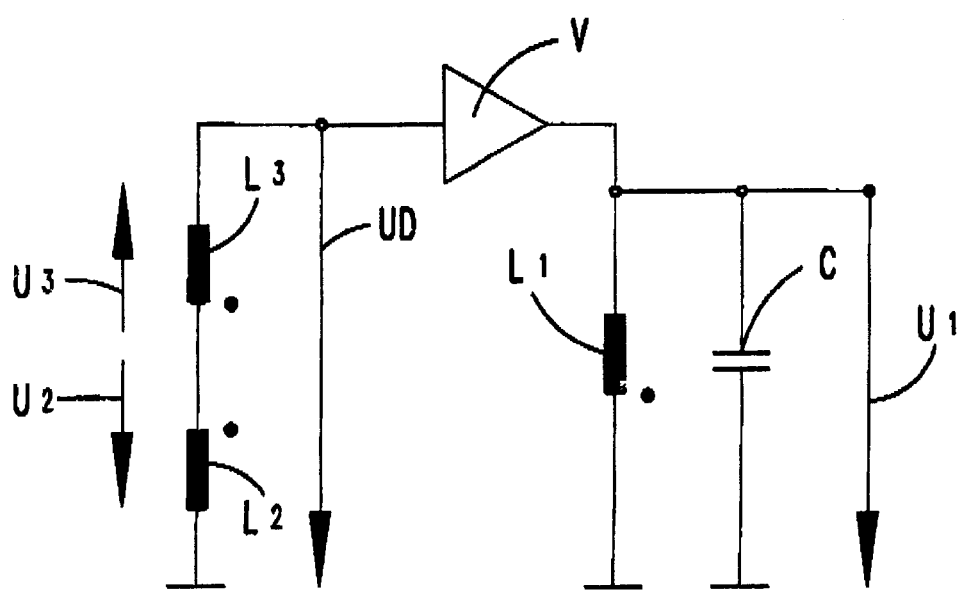

INDUCTIVE PROXIMITY SWITCH

FIELD AND BACKGROUND OF THE INVENTION

The invention relates to an inductive proximity switch having a coil situated to the rear of an "active" housing wall and belonging to a receiver circuit, its signal changing as a metallic object approaches, the coil being operatively connected to a switching amplifier which changes it switching state when the object reaches a predetermined distance.

A proximity switch of this type is known from DE 40 31 252 C1. The proximity switch there described operates in accordance with the principle in which a coil which is part of an LC oscillator generates an alternating magnetic field, and an additional coil combination which, divided up at various locations in relation to the object to be detected, evaluates the field strength. In that document, the coil combination comprises two coils which are connected one behind the other and wound in opposite senses, in which a differential alternating voltage is induced. This differential alternating voltage is fed back to the input of the oscillator amplifier in such a way that the oscillator changes its oscillation state abruptly as the differential alternating voltage passes through zero. This change is used, with an evaluation circuit, to obtain a switching signal.

Also known in the prior art are inductive proximity switches which are equipped with a coil which is located in a ferrite or carbonyl core. This coil is part of an LC oscillator which generates an alternating magnetic field. The circulating currents induced in the approaching metallic object take energy from the oscillator, which leads to a change in the oscillation state of the oscillator. This change is used to change the switching state of the proximity switch.

Such proximity switches and, in particular, those having air-cored coils or carbonyl cores are used in car-body assembly plants, in which the car bodies are welded together. The welding dust produced during welding, or the welding beads which accumulate there, can be deposited on the "active" housing wall of the proximity switch. Because of the ferromagnetic property of these welding beads or of this welding dust, there is an influence on the oscillation state of the oscillator. Proximity switches having a carbonyl core as part of an LC oscillator are influenced by welding dust on the active surface in such a way that they increase their switching distance and, above a specific level of coverage of the active surface, change their output state erroneously.

Inductive proximity switches which operate with two air-cored coils, that is to say those which evaluate a differential alternating voltage, are likewise negatively influenced as a result of the "active" surface being covered by permeable material, specifically in such a way that they reduce their switching distance. The consequence of this may be that metallic objects approaching the proximity switch are not detected, and therefore the switching state of the proximity switch is erroneous.

SUMMARY OF THE INVENTION

The invention is therefore based on the object, in an inductive proximity switch, of reducing the influence on the switching distance of any covering of the "active" surface with welding dust.

The aim is first and foremost that a supplementary sensor is associated with the "active" housing wall. This supplementary sensor advantageously has its maximum sensitivity in the region of the "active" housing wall, so that it is capable of detecting the metallic or ferrite particles substantially independently of the approach of the metallic object. The sensor signal from this supplementary sensor is used at the same time to compensate for the change in the receiver signals caused by the covering in such a way that the proximity switch switches at a constant switching distance, in spite of the covering. It is advantageous if a supplementary coil is situated behind the "active" housing wall. The supplementary coil can be disposed close to and adjacent to the "active" housing wall. The supplementary coil advantageously has a smaller coil diameter than the receiver coil. It is used to compensate electronically for changes in the receiver signals produced by metallic deposits, especially ferritic deposits, on the "active" housing wall. The receiver coil can be an air-cored coil which acts together with a further receiver coil, the difference between the alternating voltages induced in the two coils being used to derive the switching signal. The supplementary coil is then preferably connected in series with but in the opposite winding sense to the first air-cored coil, and can also be an air-cored coil. The number of turns, the diameter and the physical position of the supplementary coil are preferably chosen such that, irrespective of the degree of coverage of the "active" wall surface with metal dust or the like, the differential voltage becomes zero or the oscillation state of the oscillator remains uninfluenced if the switching distance remains constant. In a preferred refinement of the invention, the supplementary coil is situated on a circuit board. In this case, it can be formed by a conductor track etched free in a spiral. The coil of the receiver circuit is preferably also situated on the circuit board. While the coil associated with the receiver circuit is situated radially on the outside, the supplementary coil is situated radially on the inside. In a variant of the invention, the receiver coil can also be situated on a carbonyl core and provided as an oscillator coil of an oscillator. The supplementary coil is then preferably the part of a compensator circuit. By means of this compensator circuit, the degree of coverage of the "active" wall can be determined. This compensation circuit can in turn be part of an evaluation circuit. On the basis of this degree of coverage, determined in this way, the compensator circuit can supply an output signal which is fed as a control signal to a switching amplifier. The switching amplifier switches the output in accordance with the amplitude or the frequency of the high frequency generated by the oscillator. The level of the threshold is influenced by the control signal in such a way that the shift caused by the covering is thereby compensated for.

BRIEF DESCRIPTION OF THE DRAWINGS

Exemplary embodiments of the invention will be explained below with reference to accompanying drawings, in which FIG. 3 shows an illustration according to FIG. 1 of a second exemplary embodiment, FIG. 4 shows a circuit example of a proximity switch according to the prior art.

BRIEF DESCRIPTION OF THE DRAWINGS

Figure 1:
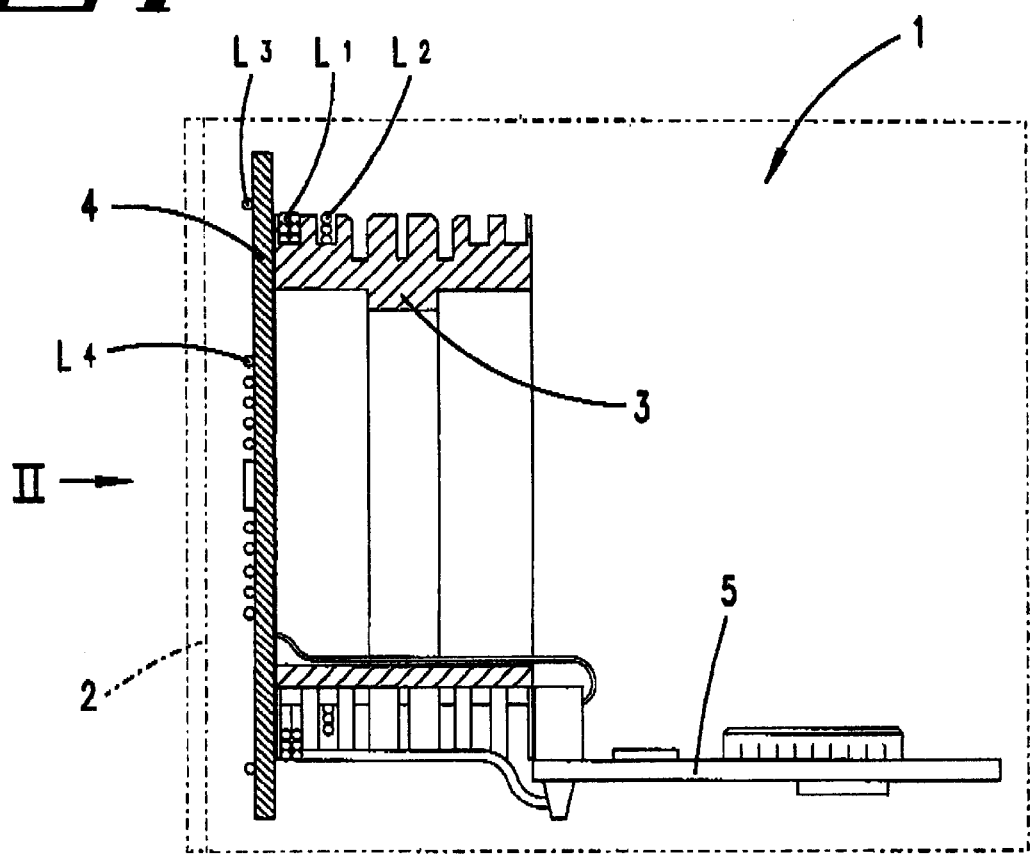
FIG. 1 shows a schematically illustrated construction of the relevant region of a proximity switch operating in accordance with the differential voltage principle.
Figure 2:
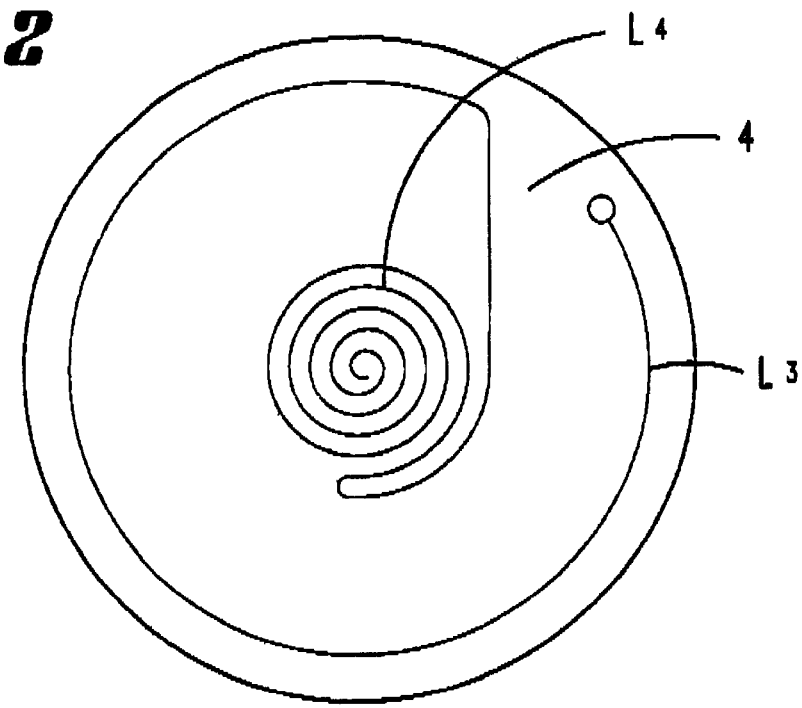
FIG. 2 shows a plan view of the coil carrier circuit board situated to the rear of the "active" housing wall.

In the exemplary embodiment illustrated in FIG. 1, the housing 1 of the proximity switch is sketched with dash-dotted lines. One housing wall 2 of the proximity switch housing forms an "active" housing wall. Situated directly behind the "active" housing wall is a circuit board 4, in a position parallel to the housing wall. Three coils L2, L3, L4 are mounted on the circuit board 4. The coil L3 comprises only a single turn and is located approximately at the edge of the substantially circular circuit board. The coil L4 is connected in series with the coil L3 and has an opposite turn sense. The coil L4 has more turns than the coil L3. The largest diameter of the coil L4 corresponds to about half the diameter of the coil L3.

In the exemplary embodiment, the coil L3 is the first coil of a differential coil arrangement L2, L3 consisting of two coils.

In the circuit of a proximity switch illustrated in FIG. 4, as is described in more detail in DE 40 31 252 C1, provision is made for an amplifier V, which supplies an output voltage U1.

The high-frequency field radiated by a high-frequency generator is influenced in such a way by a metallic trigger brought into the field that the voltage induced in the receiver coils L2 and L3 arranged one behind the other in the axial direction in relation to the coil is influenced. The receiver coils L2 and L3 are connected in opposite senses, so that the two alternating voltages induced there can compensate each other. If the alternating voltages 2 and 3 induced there are equally large, then the differential voltage UD present at the input to the amplifier V is equal to zero. If the differential voltage UD changes its sign, then the output voltage 1 present at the output of the amplifier V also changes its sign. This change of sign is used to carry out a switching operation.

Figure 5:
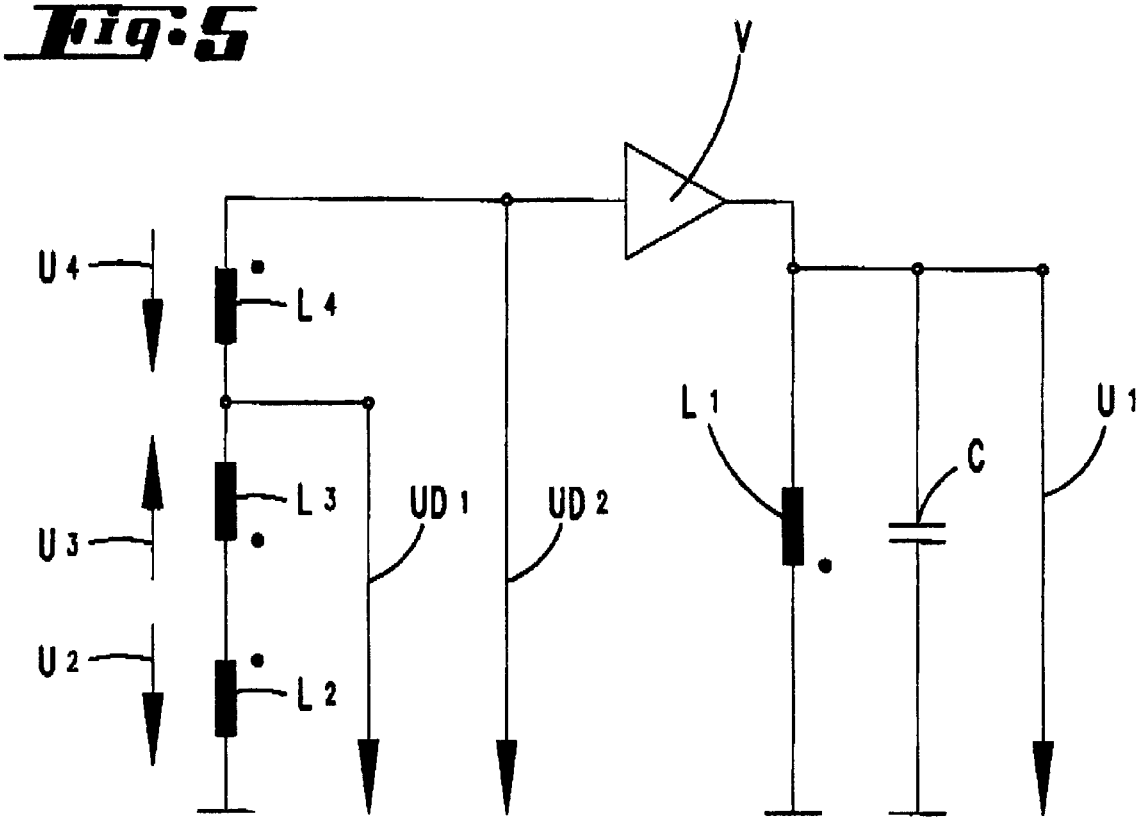
FIG. 5 shows a circuit example of a proximity switch according to the invention.

In the exemplary embodiment of the invention illustrated in FIG. 5, the voltages U2 and U3 present across the receiver coils L2 and L3 add up to a differential voltage UD1. However, the conditions under which the differential voltage UD1 becomes equal to zero change as a result of the "active" housing wall being covered by welding dust or the like. Depending on the degree of coverage, the change of sign of the voltage UD1 corresponds to a different switching distance.

A supplementary coil L4 is connected in series with the differential coil arrangement L2, L3. The coils L2 and L3 are located at different distances from the "active" housing wall. The supplementary coil L4 is then connected in series with the coil L3, which is located closer to the "active" housing wall 2 than the coil L2. The sense of the turns of the supplementary coil L4 is in this case opposite to the sense of the turns of the coil L3. The result of this is that the alternating voltage UD2 building up in the coil arrangement L2, L3, L4, which comprises three coils and is connected in series, changes its sign when the metallic trigger passes over the predetermined switching distance, irrespective of the degree of coverage of the "active" housing wall 2. The coverage of the housing wall influences the coils L3 and L4 approximately to the same extent, so that compensation takes place as a result of their antiparallelism. Since the diameter of the supplementary coil L4 however is considerably smaller than the diameter of the receiver coil L3, the receiver coil L3 is influenced significantly more by the disturbance to the field caused by the metallic trigger.

In the exemplary embodiment illustrated in FIG. 1, the receiver coil L3 is situated on the edge of a circuit board 4 located directly behind the "active" housing wall 2. The coil L3 has only one turn. Located at the centre of the coil L3 is a coil L4 which consists of a plurality of turns, the sense of which runs opposite that of the coil L3. Directly behind the circuit board, a field generating coil L1, which is part of an oscillator, is situated on a coil former. A further receiver coil L2, which is connected in series with the coil L3, is situated on the rear of the circuit board.

In the exemplary embodiment illustrated in FIG. 3, only the supplementary coil L4 is disposed on a circuit board. The coils L2 and L3 belonging to the differential coil arrangement are both wound onto a coil former 3 on this side and the other side of a field generating coil L1. The evaluation circuit is disposed on a circuit board 5.

Figure 6:
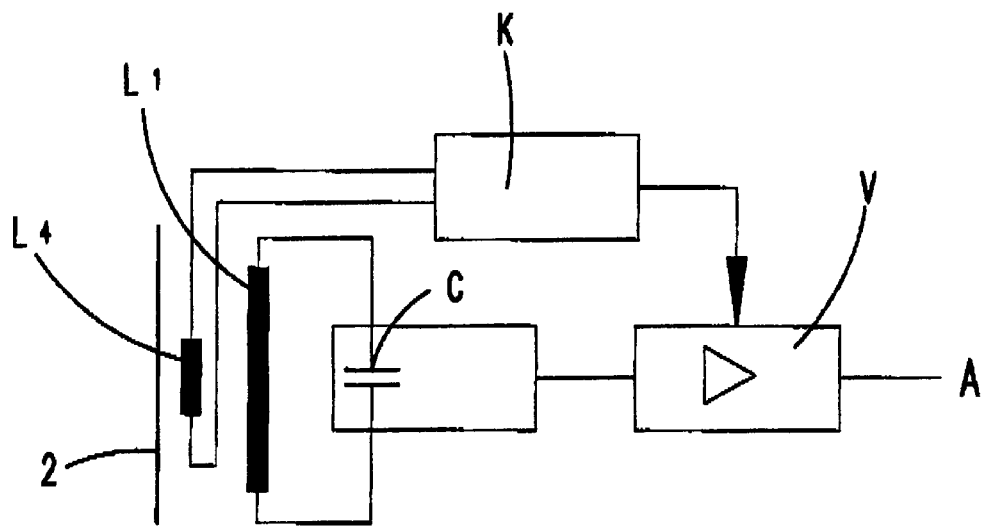
FIG. 6 shows a circuit example of a further proximity switch, in which the coil is part of an oscillator.

FIG. 6 illustrates a further exemplary embodiment of the invention. While in the exemplary embodiments illustrated in FIGS. 1 and 3 the coils are air-cored coils, the coil L1 in the exemplary embodiment according to FIG. 6 is mounted on a carbonyl core. The coil L1 forms, with the capacitor C, an oscillator tuned circuit. The output signal from the oscillator tuned circuit is fed to a switching amplifier V.

A supplementary coil L4 is situated between the coil L1 and the "active" housing wall 2. The supplementary coil L4 has a smaller diameter than the coil L1. The supplementary coil L4 is part of a compensator K. This compensator drives, for example, the coil L4 with a high-frequency alternating voltage and, by way of the change in the coil losses or the like in the coil L4, can determine the degree of coverage of the active housing wall 2 with welding dust or the like. The compensator circuit K provides an output signal from the change in the electrical parameters of the coil L4. This output signal is fed to the switching amplifier V. Depending on the level of the output signal from the compensator circuit K, the switching amplifier V changes the threshold value at which, when it is crossed upwards or downwards, the output signal A is changed. As a result of this wiring arrangement, the coverage of the "active" housing wall with welding dust or welding beads can be compensated for even in the case of a proximity switch with a carbonyl core.

We claim:

1. Inductive proximity switch having a coil situated to a rear of an active housing wall and belonging to a receiver circuit, its signal changing as a metallic object approaches, the coil being operatively connected to a switching amplifier which changes its switching state when the object reaches a predetermined distance, the proximity switch further comprising a supplementary coil, influenced by the active housing wall (2), to provide electronic compensation for changes in receiver signals produced by metallic deposits, especially ferric deposits, on the active housing wall (2).

2. Inductive proximity switch according to claim 1, wherein the coil of the receiver circuit is at least in part a receiver coil, and wherein the supplementary coil (L4) has a smaller coil diameter than that of the receiver coil (L1, L2, L3).

3. Inductive proximity switch according to claim 2, wherein the supplementary coil is disposed as adjacent as possible to the active housing wall (2).

4. Inductive proximity switch according to claim 2, wherein said receiver coil (L3) is an air-cored coil.

5. Inductive proximity switch according to claim 2, wherein the receiver coil (L1) is an oscillator coil, wherein said oscillator coil is situated on a carbonyl core and belonging to an oscillator, and the supplementary coil (L4) is part of compensator (K).

6. Inductive proximity switch according to claim 5, further comprising an amplifier (V), and wherein an output signal from the compensator (K) influences the threshold switching value of said amplifier (V).

7. Inductive proximity switch according to claim 2, wherein said receiver coil (L3) comprises a single turn.

8. Inductive proximity switch according to claim 2, wherein said diameter of said supplementary coil is substantially half said diameter of said receiver coil.

9. Inductive proximity switch having a coil situated to a rear of an active housing wall and belonging to a receiver circuit, its signal changing as a metallic object approaches, the coil being operatively connected to a switching amplifier which changes its switching state when the object reaches a predetermined distance, the proximity switch further comprising a supplementary coil, influenced by the active housing wall (2), to provide electronic compensation for changes in receiver signals produced by metallic deposits, especially ferric deposits, on the active housing wall (2), wherein the coil of the receiver circuit is at least in part a receiver coil, and wherein the supplementary sensor comprises a supplementary coil (L4) which has a smaller coil diameter than that of the receiver coil (L1, L2, L3), wherein said receiver coil (L3) is an air-cored coil, wherein a switching signal indicative of a voltage difference (UD) of voltages induced in said receiver coil in relation to a second air-cored coil (L2), the supplementary coil (L4) being connected in series with but in opposite turns direction to said receiver coil (L3).

10. Inductive proximity switch having a coil situated to a rear of an active housing wall and belonging to a receiver circuit, its signal changing as a metallic object approaches, the coil being operatively connected to a switching amplifier which changes its switching state when the object reaches a predetermined distance, the proximity switch further comprising a supplementary coil, influenced by the active housing wall (2), to provide electronic compensation for changes in receiver signals produced by metallic deposits, especially ferric deposits, on the active housing wall (2), wherein the coil of the receiver circuit is at least in part a receiver coil, and wherein the supplementary sensor comprises a supplementary coil (L4) which has a smaller coil diameter than that of the receiver coil (L1, L2, L3), wherein the receiver circuit has at least two coils for producing a differential voltage, wherein the number of turns, the diameter and the physical position of the supplementary coil (L4) are arranged that, irrespective of degree of coverage of the active housing wall surface (2) with metal dust, a differential voltage (UD2) indicative of a voltage difference between the two receiver coils and the supplementary coil becomes zero if switching distance remains constant.

11. Inductive proximity switch having a coil situated to a rear of an active housing wall and belonging to a receiver circuit, its signal changing as a metallic object approaches, the coil being operatively connected to a switching amplifier which changes its switching state when the object reaches a predetermined distance, the proximity switch further comprising a supplementary coil, influenced by the active housing wall (2), to provide electronic compensation for changes in receiver signals produced by metallic deposits, especially ferric deposits, on the active housing wall (2), wherein the coil of the receiver circuit is at least in part a receiver coil, and wherein the supplementary sensor comprises a supplementary coil (L4) which has a smaller coil diameter than that of the receiver coil (L1, L2, L3), wherein the supplementary coil (L4) is formed by a conductor track disposed on a circuit board (4).

12. Inductive proximity switch according to claim 11, wherein both the supplementary coil (L4) and said receiver coil (L3) are disposed on the circuit board.

13. Inductive proximity switch according to claim 12, wherein said receiver coil (L3) is located at an edge of the circuit board.

* * * * *